United States Patent
Conradi

(10) Patent No.: US 8,502,599 B2
(45) Date of Patent: Aug. 6, 2013

(54) SYSTEM AND METHOD FOR A MULTI-BAND POWER-AMPLIFIER

(75) Inventor: Carl Conradi, Ottawa (CA)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/277,058

(22) Filed: Oct. 19, 2011

(65) Prior Publication Data

US 2013/0099866 A1 Apr. 25, 2013

(51) Int. Cl.
*H03F 3/68* (2006.01)

(52) U.S. Cl.
USPC .......................................................... 330/126

(58) Field of Classification Search
USPC ..................................... 330/124 R, 126, 295
See application file for complete search history.

(56) References Cited

U.S. PATENT DOCUMENTS

| | | | | |
|---|---|---|---|---|
| 7,602,241 B2* | 10/2009 | Suzuki et al. | ............ | 330/124 R |
| 2009/0322421 A1 | 12/2009 | Mueller et al. | | |

FOREIGN PATENT DOCUMENTS

| | | |
|---|---|---|
| CN | 101093978 | 12/2007 |
| CN | 202014226 | 10/2011 |
| EP | 2 159 912 A1 | 3/2010 |
| WO | WO 2011127868 (A2) | 10/2011 |

OTHER PUBLICATIONS

Doherty, W.H., "A New High-Efficiency Power Amplifier for Modulated Waves," Bell Telephone System Technical Publication, Annual Convention of the Institute of Radio Engineers, May 1936, Cleveland, Ohio, 25 pages.

Kunihiro, K., et al., "A Diplexer-matching Dual-band Power Amplifier LTCC Module for IEEE 802.11a/b/g Wireless LANs," TU2A-4, 2004 IEEE Radio Frequency Integrated Circuits Symposium, pp. 303-306.

Grebennikov, A., "Power Amplifier Design for Communication Systems," Chapter 9, 2005, McGraw-Hill, pp. 372-381.

Cripps, S.C., "Efficientcy Enhancement Techniques," RF Power Amplifiers for Wireless Communications $2^{nd}$ Edition, 2006, Artech House, pp. 285-303.

International Search Report and Written Opinion of PCT/CN2012/082754, mailing date Jan. 17, 2013, 13 pgs.

"Part 11: Wireless LAN Medium Access Control (MAC) and Physical Layer (PHY) Specifications: IEEE Standard for Information Technology, Telecommunications and information exchange between systems, Local and metropolitan area networks, Specific requirements," Std 802.11-2007, Jun. 12, 2007, 1,233 pgs.

* cited by examiner

*Primary Examiner* — Steven J Mottola

(74) *Attorney, Agent, or Firm* — Slater & Matsil, L.L.P.

(57) ABSTRACT

In accordance with an embodiment, a method of amplifying a plurality of frequency bands includes amplifying a first frequency band and a second frequency band with a main amplifier, amplifying the first frequency band with a first peaking amplifier, amplifying the second frequency band with a second peaking amplifier, and simultaneously load modulating an output of the main amplifier with an output of the first peaking amplifier and with an output of the second peaking amplifier.

35 Claims, 9 Drawing Sheets

SYSTEM AND METHOD FOR A MULTI-BAND POWER-AMPLIFIER

TECHNICAL FIELD

The present invention relates generally to wireless communication systems, and more particularly to a system and method for multi-band power amplifier.

BACKGROUND

Wireless communication systems are widely used to provide voice and data services for multiple users using a variety of access terminals such as cellular telephones, laptop computers and various multimedia devices. Such communications systems can encompass local area networks, such as IEEE 801.11 networks, cellular telephone and/or mobile broadband networks. The communication system can use a one or more multiple access techniques, such as Frequency Division Multiple Access (FDMA), Time Division Multiple Access (TDMA), Code Division Multiple Access (CDMA), Orthogonal Frequency Division Multiple Access (OFDMA), Single Carrier Frequency Division Multiple Access (SC-FDMA) and others. Mobile broadband networks can conform to a number of system types or partnerships such as, General Packet Radio Service (GPRS), 3rd-Generation standards (3G), Worldwide Interoperability for Microwave Access (WiMAX), Universal Mobile Telecommunications System (UMTS), the 3rd Generation Partnership Project (3GPP), Evolution-Data Optimized (EV-DO), or Long Term Evolution (LTE).

Many wireless broadband network systems comprise base stations that serve mobile user devices. Within the wireless base station, the power amplifier (PA) is a key component. As more and more networks are deployed, there is an ever-increasing pressure to improve the efficiency of these amplifiers. Power efficiency is a measure of RF (AC) output power related to DC input power. As power amplifiers become more power efficient, the need for cooling requirements such as fans is reduced. Furthermore, reduced power amplifier power reduces the cost to operate the base station.

One way to achieve efficiency improvements in power amplifiers is by allowing the constituent power transistors to operate closer to saturation. Structures such as Doherty amplifiers allow for a given power transistor to operate near or at saturation over an extended output power range. This helps facilitate the efficient amplification of amplitude modulated signals with high peak-to-average-power ratios, as are found in modern wireless communication systems. The power efficiency improvement of traditional Doherty amplifiers over single ended class AB amplifiers is limited to bandwidths that are less than 20% of the carrier frequency. This often limits a Doherty amplifier to be used within a single designated frequency band. To transmit signals in multiple frequency bands simultaneously, multiple, separate and frequency specific amplifier modules that contain the Doherty structure in the final output stage are usually deployed.

SUMMARY OF THE INVENTION

In accordance with an embodiment, a method of amplifying a plurality of frequency bands includes amplifying a first frequency band and a second frequency band with a main amplifier, amplifying the first frequency band with a first peaking amplifier, amplifying the second frequency band with a second peaking amplifier, and simultaneously modulating the load impedance of the main amplifier in the first frequency band with an output of the first peaking amplifier and the load impedance of the main amplifier in the second frequency band with an output of the second peaking amplifier.

In accordance with a further embodiment, a multiband RF power amplifier includes a plurality of peaking amplifiers, where each of the plurality of peaking amplifiers is configured to amplify a different band of a plurality of frequency bands. The amplifier also includes a main amplifier configured to amplify the plurality of frequency bands, and a combiner. The combiner is configured to couple outputs of the plurality of peaking amplifiers and the output of the main amplifier to a combined output. The outputs of the plurality of peaking amplifiers are configured to simultaneously load modulate the output of the main amplifier in each of the plurality of frequency bands.

In accordance with a further embodiment, a multi-band RF power amplifier includes a main amplifier, a first peaking amplifier, a second peaking amplifier, and a combiner, such that the first peaking amplifier and the second peaking amplifier are configured to simultaneously load modulate the output of the main amplifier in the $1^{st}$ and $2^{nd}$ bands respectively. The main amplifier is configured to amplify a first frequency band and a second frequency band, where the second frequency band is different from the first frequency band. Further, the first peaking amplifier is configured to amplify the first frequency band, and the second peaking amplifier configured to amplify the second frequency band. The combiner couples outputs of the first peaking amplifier and the second peaking amplifier to an output of the main amplifier.

In accordance with another embodiment, a multi-band RF power amplifier includes a main amplifier, a first peaking amplifier, a second peaking amplifier, a frequency selective network, a first transmission line impedance transformer, a second transmission line impedance transformer, a third transmission line impedance transformer, and a fourth transmission line impedance transformer. The main amplifier is configured to amplify a first frequency band and a second frequency band, where the second frequency band is different from the first frequency band. Furthermore, the first peaking amplifier is configured to amplify the first frequency band, and the second peaking amplifier is configured to amplify the second frequency band, such that an output of the first peaking amplifier and an output of the second peaking amplifier load modulate the output of the main amplifier in the first and second bands respectively.

In an embodiment, the frequency selective network includes an input port coupled to the output of the main amplifier, a first port configured to selectively pass the first frequency band from the input port, and a second port configured to selectively pass the second frequency band from the input. The first transmission line impedance transformer is coupled between the output of the first peaking amplifier and the first port of the first frequency selective network, the second transmission line impedance transformer is coupled between the output of the second peaking amplifier and the second port of the first frequency selective network, the third transmission line impedance transformer has a first end coupled to the output of the first peaking amplifier, and the fourth transmission line impedance transformer has a first end coupled to the output of the second peaking amplifier.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely multi-band RF amplifier. The invention may also be applied to other circuits and systems used to produce a multi-band signal.

In an embodiment, high power efficiencies are achieved in a single amplifier module that is designed to amplify a signal that simultaneously occupies multiple frequency bands by using designated peaking amplifiers for each one of the frequency bands. The main amplifier amplifies the multi-band signal. The band specific peaking amplifiers, in conjunction with the transmission line impedance transformers, impedance matching networks and frequency selective network, load modulate the output of the main amplifier in the same frequency bands in which they operate. By simultaneously and optimally modulating the load impedance of the main amplifier in each of the occupied bands of the multi-band signal, the main amplifier and overall amplifier module will operate more efficiently. The output of the main amplifier is combined with the output of the peaking amplifiers using a frequency selective network, impedance transformers and a plurality of Doherty combiners. The frequency selective network may take the form of a duplexer, diplexer or multiplexer.

In one embodiment, each output of the frequency selective network is impedance matched to a system impedance by a plurality of single band impedance matching networks and transmission line impedance transformers coupled to outputs of each of the peaking amplifiers. In some embodiments, the transmission line impedance transformer may be achieved using a lumped element circuit. The outputs of the peaking amplifiers, in turn are coupled to an output frequency selective network, via one or more further transmission line impedance transformers. The transmission line impedance transformers may be a single or a cascade of multiple quarter wave transmission lines, coupled transmission line structures or any other types of impedance matching networks. In some embodiments, a circulator may be coupled between each transmission line impedance transformer and the output of the frequency selective network.

Figure 1:
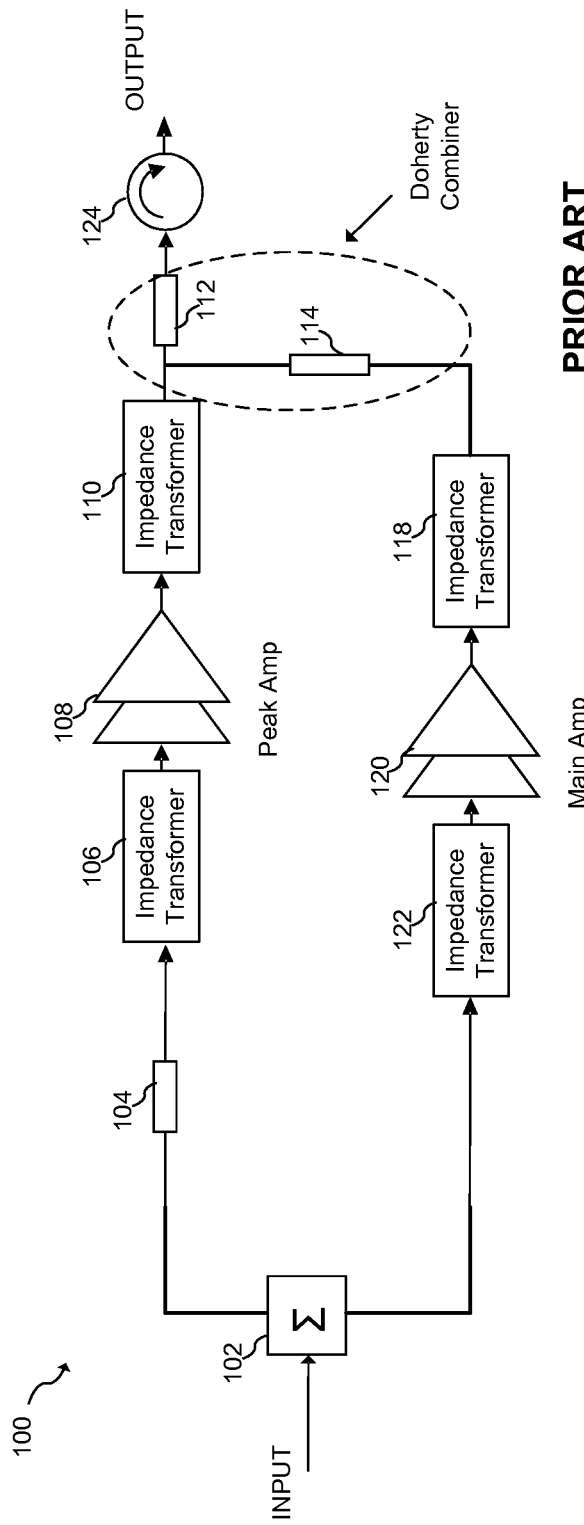
FIG. 1 illustrates a schematic of a conventional Doherty amplifier.

FIG. 1 illustrates conventional Doherty amplifier 100, having main amplifier 120 and peaking amplifier 108. Main amplifier 120 is biased such that it amplifies an amplitude-modulated signal over its full dynamic range, while peaking amplifier 108 is biased such that it amplifies only the portion of the amplitude modulated signal from its peak envelope power to a threshold backed-off from the peak envelope power. For example, peaking amplifier 108 may only amplify the peaks or the upper dynamic range of the amplitude-modulated signal. Otherwise, the peaking amplifier is off for the remaining envelope levels. In many conventional embodiments, main amplifier 120 and peaking amplifier 108 are each implemented using a single power transistor.

In Doherty amplifier 100, the amplifier input is coupled to power splitter 102, the outputs of which are coupled to main amplifier 120 via impedance transformer 122 and to peak amplifier 108 via impedance transformer 106 and transmission line impedance transformer 104. Single band impedance transformers 106, 110, 118 and 122 function as matching networks. The output of main amplifier 120 is coupled to the output of peak amplifier 108 via impedance transformers 110 and 118 and transmission line impedance transformer 114. The outputs of transmission line impedance transformer 114 and matching network 110 are coupled to the output of the Doherty amplifier via transmission line impedance transformer 112 and circulator 124. The combination of transmission line impedance transformers 112 and 114 are commonly known as a Doherty combiner. As such, the outputs of the main amplifier 120 and peaking amplifier 108 are combined in such a way that when the peaking amplifier is off, the main amplifier sees a different load impedance than when the peaking amplifier is on. Therefore, the main amplifier sees a different load impedance for portions of the amplitude-modulated signal whose envelope is backed-off from the peak envelope power than at the peak envelope power. This may allow a transistor's load impedance to be optimized for power efficiency over a range of output power levels rather than at a single power level. By modulating the load impedance of the main transistor in relation to the signal envelope, Doherty amplifier 100 may achieve a higher efficiency in the region backed-off from the peak envelope power than could be achieved using a standard single-ended transistor amplifier.

The extra efficiency achieved by Doherty amplifier 100 compared to a single amplifier is typically limited to systems having a bandwidth less than 20% of the carrier frequency. This bandwidth limitation is due to the combiner networks for the main and peaking amplifiers that are typically implemented using narrow-band quarter-wave transmission line impedance transformers; and due to the matching networks between the drain and the Doherty combiner. The combiner and the transistor matching networks in conjunction with the turning on and off of the peaking transistor are unable to optimally load modulate the main transistor to maintain maximum efficiency over a wide bandwidth.

In some conventional embodiments, multi-band amplification is achieved by deploying multiple, separate and frequency specific amplifier modules that contain traditional Doherty amplifiers in the final output stage of the amplifier module. Therefore, for two bands that are sufficiently spaced from each other, two amplifier modules containing Doherty amplifiers in their output stage requiring a total of four power transistors (2 transistor per output stage) are used, including, for example, one transistor for each of the two main amplifiers, and one transistor for each of the two peaking amplifiers.

Embodiments of the present invention remove the bandwidth limitation of the traditional Doherty amplifier by using a single wideband main amplifier connected through a frequency selective network to a band specific matching network, a Doherty combiner and band specific peaking amplifier. In some embodiments, a dual band Doherty-like power amplifier may be implemented using three power transistors instead of the four power transistors used by two traditional Doherty amplifiers.

In an embodiment, a Doherty-like power amplifier (PA) has a single main transistor that transmits signals in two or more frequency bands, where each frequency band has its own peaking transistor and Doherty combiner. Peaking transistors, the output impedance matching networks of the peaking transistors, the Doherty combiner, and a portion of the output-matching network of the main transistor of each frequency band are isolated from each other and connected to the common main transistor through a frequency selective network. The frequency selective network may take the form of a duplexer, diplexer or multiplexer. An output frequency selective network may be used to combine the output signals of each frequency band for a common feed.

By isolating the peaking transistors, the output impedance matching networks of the peaking transistors, the Doherty combiner and the matching network between the Doherty combiner and the frequency selective network with the frequency selective network, the main amplifier's load impedance may be simultaneously optimized for power efficiency for each frequency band. This allows the main amplifier to simultaneously achieve a high efficiency for each frequency band.

Figure 2A:
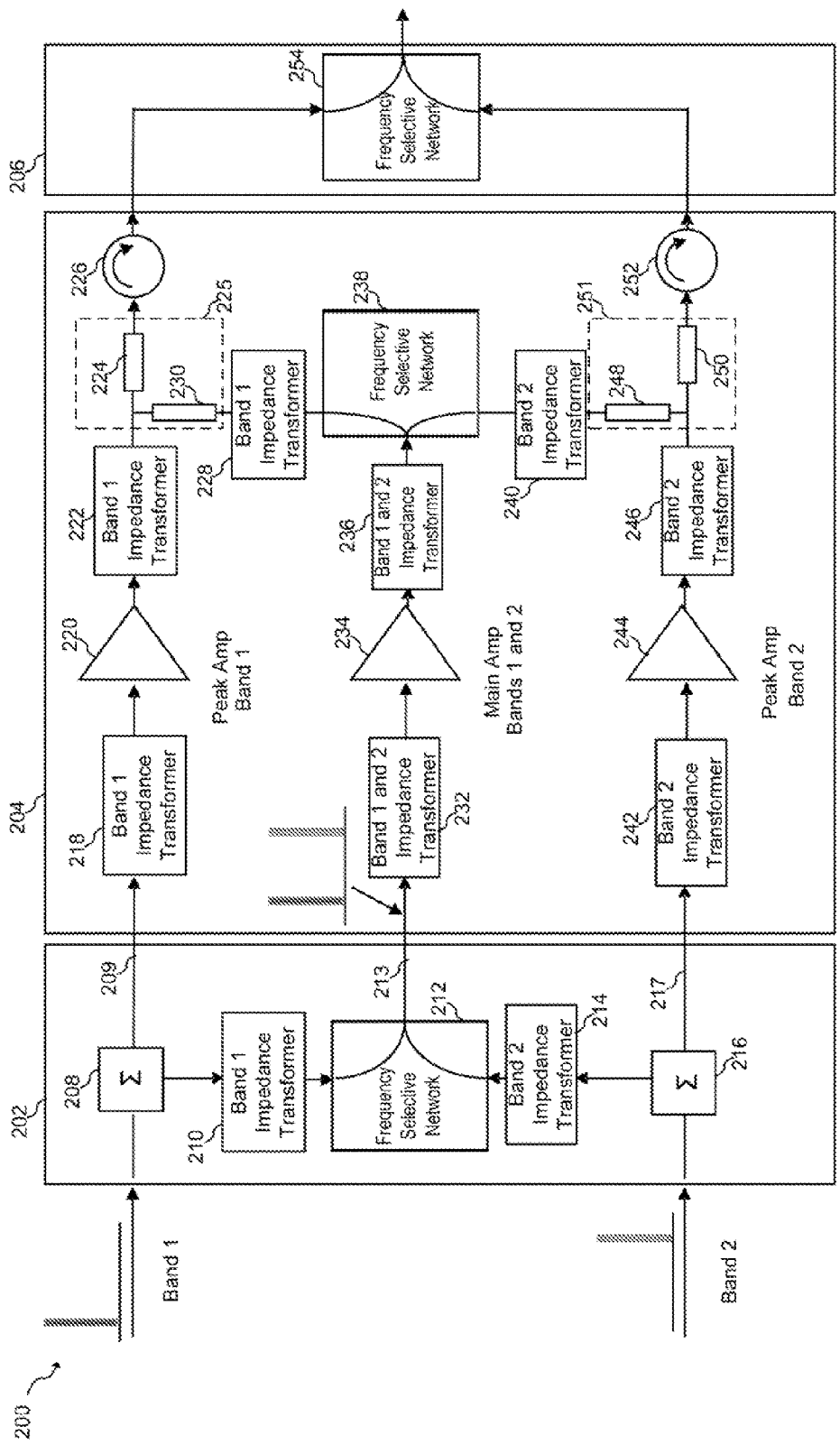
FIG. 2a-2d illustrate schematics of a multi-band amplifier according to an embodiment of the present invention.

FIG. 2a illustrates power amplifier 200 according to an embodiment of the present invention. Power amplifier has input section 202, amplifier section 204 and combiner section 206. In an embodiment, peaking amplifier 220 amplifies signal 209 having spectral content at frequency band 1, peaking amplifier 244 amplifies signal 217 having spectral content at frequency band 2, and main amplifier 234 amplifies signal 213 containing both frequency bands 1 and 2. The output of peaking amplifier 220 is combined with the output of main amplifier 234 via frequency selective network 238, impedance matching networks 236, 222 and 228, and Doherty combiners 225. Likewise, the output of peaking amplifier 244 is combined with the output of main amplifier 234 via frequency selective network 238, impedance matching networks 236, 246 and 240, and Doherty combiners 251. In an embodiment, main amplifier 234 operates over the full dynamic range of the band 1 and band 2 signals. Peaking amplifiers 220 and 244, however, operate over the top end of the dynamic range for the band 1 and band 2 signals respectively. In some embodiments, this may be achieved by biasing amplifier 234 for class B or class AB operation and biasing peak amplifiers 220 and 244 for class C operations. Amplifiers 220, 234 and 244 may be configured according to techniques known in the art with respect to Doherty amplifiers. For example, in some embodiments, the maximum power available in a single band in the peaking amplifiers 220 and 244 may be the same as the maximum power available in a single band in the main amplifier 234 for symmetric Doherty operation, or sized differently for asymmetric Doherty operation. The main and the peaking amplifier devices may also be of different semiconductor material.

Output block 206 may be co-located with amplifier section 204, or remotely located from amplifier section 204 within, for example a base station system. In one embodiment, output block 206 is coupled to the outputs of circulators 226 and 252 with cables. In an alternative embodiment, the outputs of circulators 226 and 252 are routed separately to separate antennas.

Figure 2B:
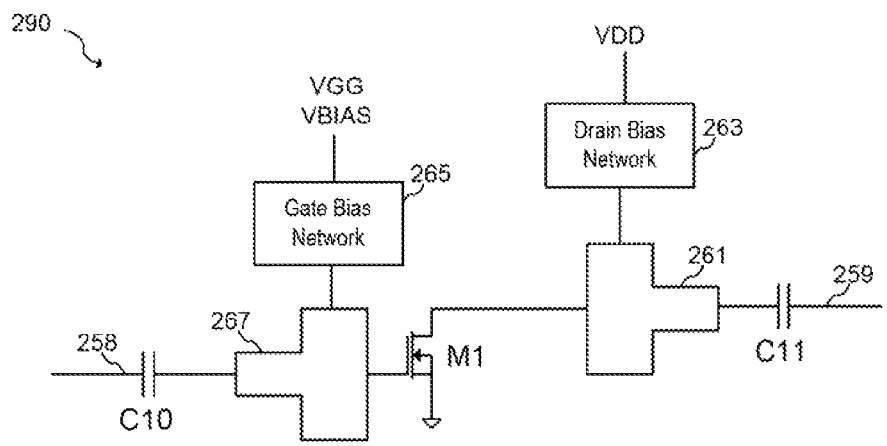

FIG. 2b illustrates an embodiment schematic of an amplifier 290 with associated input and output matching networks 267 and 261 that may be used to implement main amplifier 234 and peaking amplifiers 220 and 244. The gate of transistor M1 is coupled to matching network 267, and is biased to voltage VGG VBIAS via gate bias network 265. Amplifier input 258 is coupled to input matching network 267 via DC blocking capacitor C10. The drain of transistor M1 is coupled to output matching network 261 and is biased to VDD via drain bias network 263. Amplifier output 259 is coupled to matching network 261 via DC blocking capacitor C11. In some embodiments, input matching network 267 may be used to implement impedance transformers 218, 232 and 242 shown in FIG. 2a. Likewise, output matching network 261 may be used to implement impedance transformers 222, 236 and 246. In the depicted embodiment, matching networks 261 and 267 may be formed using transmission lines (micro-strip, stripline and/or co-planar waveguide structures, co-axial transmission lines) and/or lumped elements.

In an embodiment, M1 may be implemented using a RF power transistor of material such as Silicon, Gallium Nitride, Gallium Arsenide, Silicon Germanium, and other materials. Transistor M1 may be a Laterally Diffused Metal Oxide Silicon (LDMOS) transistor, a Heterojunction Bipolar Transistor (HBT), a High Electron Mobility Transistor (HEMT), or another RF transistor type. It should be further appreciated that the amplifier topology illustrated in FIG. 2b is just one example of many possible amplifier topologies that may be used to implement embodiment amplifiers.

In an embodiment, frequency selective network 238 of FIG. 2a is a frequency selective network such that band 1 is passed and band 2 is rejected in path between main amplifier 234 and Doherty combiner 225. Likewise, band 2 is passed and band 1 is rejected by frequency selective network 238 in the path between main amplifier 234 and Doherty combiner 251. In some embodiments, the frequency selective network is implemented using an LC lumped element circuit, planar filters having micro-strip, stripline and/or co-planar waveguide structures, co-axial transmission lines, cavity filters, dielectric filters or electro-acoustic filters. In some embodiments, frequency selective network 238 is a passive, low-loss network that can withstand high transmit power. In some embodiments, frequency selective network 238 may also be tunable in frequency.

Figure 2C:
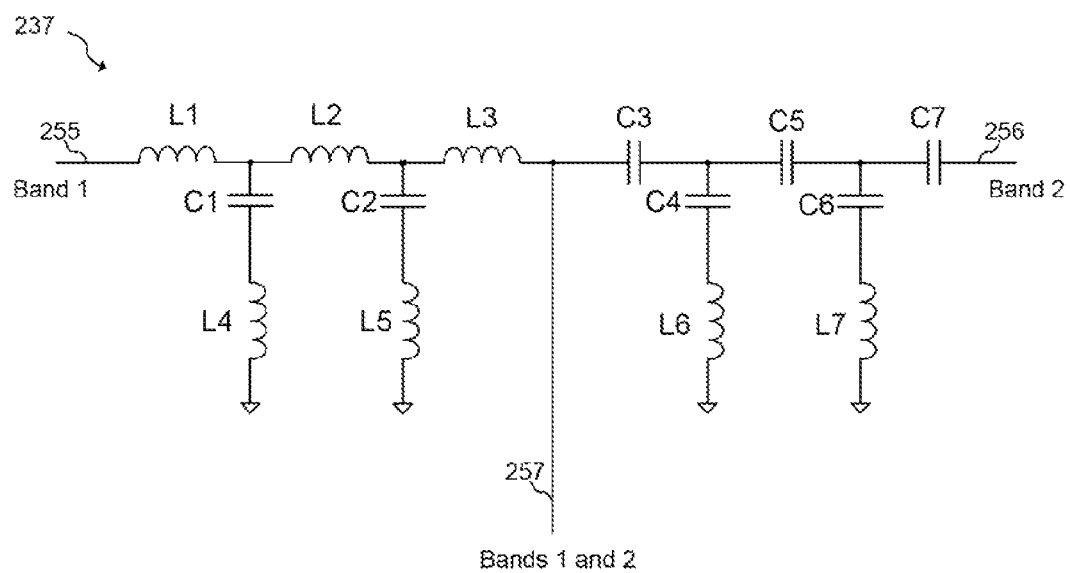

FIG. 2c illustrates frequency selective network 237 according to one embodiment of the present invention, which may be used to implement frequency selective networks 212, 238 and 254. Frequency selective network 237 is implemented as a fifth-order low-pass/high-pass lumped element diplexer with two transmission zeros. Alternatively, other filter topologies and implementation technologies may be used. For example, planar filters having micro-strip, stripline and/or co-planar waveguide structures, co-axial transmission lines, cavity filters, dielectric filters or electro-acoustic filters may be used instead of or in addition to lumped elements. Furthermore, a filter order greater than or less than the fifth-order filter shown may also be used. Also, other frequency responses besides a low-pass/high-pass may be used. In an embodiment, node 255 is coupled to impedance transformer 228 (FIG. 2a), node 256 is coupled to impedance transformer 240, and node 257 is coupled to impedance transformer 236. In some embodiments, frequency selective network 238 illustrated in FIG. 2c may also be used to implement frequency selective network 254, in which case node 255 is coupled circulator 226, node 256 is coupled to circulator 252, and node 257 is coupled to the system output of block 206.

Frequency selective network 237 has inductors L1 to L7 and capacitors C1 to C7 which are determined according to filter-design and synthesis techniques known in the art. The values of these components will vary depending on the particular system and its specifications.

Figure 2D:
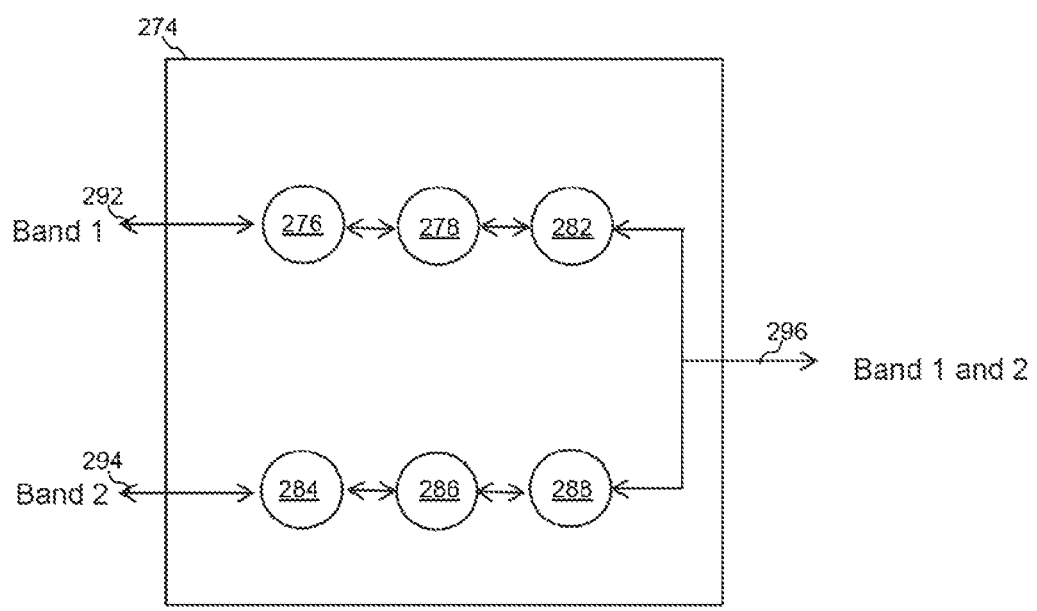

FIG. 2d illustrates frequency selective network 274 that may also be used to implement frequency selective networks 212, 238 and 254. Frequency selective network 237 is implemented as a duplexer having resonators 276, 278 and 282 for band 1, and resonators 284, 286 and 288 for band 2. In an embodiment, resonators 276, 278 and 282 create a bandpass response centered around band 1 between the band 1 port 292 and combined port 296. Similarly, resonators 284, 286 and 288 create a bandpass response centered around band 2 between the band 2 port 294 and combined port 296. In some embodiments, the resonators of frequency selective network 274 are implemented using lumped elements such as inductors and capacitors. Alternatively, other structures may be used to implement the duplexer 274, such as planar elements having micro-strip, stripline and/or co-planar waveguide structures, co-axial transmission lines, cavity resonators, dielectric resonators or electro-acoustic resonators. Resonator elements 276, 278, and 282 may be configured to allow for different frequency responses such as low-pass, high-pass, band-pass and band-stop. Resonator elements 284, 286 and 288 may also be configured to allow for different frequency responses such as low-pass, high-pass, band-pass and band-stop. Furthermore, it should be appreciated that less than or greater than three resonators may be used for each individual frequency band path.

Turning back to FIG. 2a, Doherty combiner 225 has transmission line impedance transformers 224 and 230, and Doherty combiner 251 has transmission line impedance transformers 248 and 250. In an embodiment, transmission line impedance transformers 224 and 230 are each configured to provide about a 90-degree phase shift for band 1 frequencies, while transmission line impedance transformers 248 and 250 are each configured to provide about a 90-degree phase shift for band 2 frequencies. In an embodiment, the characteristic impedance of transmission line impedance transformers 230 and 248 are selected to be about the target final load impedance of the main and peaking amplifiers at peak envelope power, for example 50Ω, while the characteristic impedance of transmission line impedance transformers 224 and 250 are selected to be about the geometric mean between the isolator impedance and the target load impedance of the main and peaking amplifier at peak envelope power. For example, in one embodiment, the characteristic impedance of transmission line impedance transformers 224 and 250 is selected to be about 35Ω, which is approximately $$\frac{1}{\sqrt{2}}$$

times the 50Ω characteristic impedance of the system, for example. These examples pertain to a single quarter wave impedance transformer. For dual stage impedance transformers, the characteristic impedance of the transmission lines may be different. Alternatively, other impedances may be used. It should be further noted the characteristic impedance of transmission line impedance transformers 230 and 248 may be about the same or different, and the characteristic impedance of transmission line impedance transformers 230 and 248 may be about the same or different.

Transmission line impedance transformers 224, 230, 248 and 250 may be implemented using planar transmission lines, lumped elements, co-axial transmission lines or any other form of transmission line or a combination of lumped elements and planar elements. In some embodiments, the function of transmission line impedance transformers 230 and 248 may be included in matching networks or impedance transformers 228 and 240, respectively. In some embodiments, the extra phase delay caused by transmission line impedance transformers 230 and 248 may be compensated by providing an additional transmission line impedance transformer in series with the input of peaking amplifier 220 and an additional transmission line impedance transformer in series with the input of peaking amplifier 244. In some embodiments, the function of this extra phase delay may be included in matching networks 218 and 242. Circulators 226 and 252 may be included to isolate amplifier section 204 from output stage 206 and to provide the outputs of Doherty combiners 225 and 251 with a defined impedance. In one embodiment, the third ports (not shown) of circulators 226 and 252 are loaded with a 50Ω resistor. It should be appreciated that other characteristic impedances may be used in alternative embodiments.

In an embodiment, for band 1 signal levels below the threshold of operation of peak amplifier 1, the output impedance of peak amplifier 1 is high, and does not load the impedance transformation network having elements 230, 228, 238 and 236. Therefore, the characteristic impedance at circulator 226 (i.e. 50Ω) is transformed to a load impedance at the output of main amplifier 234 directly through elements 224, 230, 228, 238 and 236 that allows amplifier 234 to operate more efficiently or most efficiently for signals below the turn on threshold of the peaking amplifier 220. At higher signal power levels, peaking amplifier 220 begins to operate, thereby lowering the output impedance of peaking amplifier 220 and loading the impedance transformation network having elements 230, 228, 238 and 236. When both peaking amplifier 220 and main amplifier 234 are operating at the peak envelope power level, the load impedance in band 1 seen at the output of main amplifier 234 is the characteristic impedance of the system transformed through the elements 230, 228, 238 and 236. By optimizing the output impedance seen by main amplifier 234, amplifiers 220 and 234 may both operate efficiently in regions near peak output for signals within frequency band 1. Therefore, in some embodiments, there is a need to optimize the impedance transformation properties of elements 230, 228, 238 and 236 for two different conditions: peak envelope power and at the threshold where the peaking amplifier turns on. The same explanation may also be applied to peaking amplifier 244 working in conjunction with main amplifier 234. It should be appreciated that operation of amplifiers 220, 234 and 244 proceeds simultaneously and independently in both bands 1 and 2. For example, if band 2 has a large signal envelope and band 1 has a small signal envelope, peaking amplifier 244 may be in active operation while peaking amplifier 220 offers a high output impedance to elements 230, 228, 238 and 236. Likewise, if both bands 1 and 2 have a large signal envelope, both peaking amplifier 220 and peaking amplifier 244 may be actively operating.

In an embodiment, matching networks 218 and 222 provide an input and output impedance match for amplifier 220 for frequencies in the first frequency band, while matching networks 242 and 246 provide an input and output impedance match for amplifier 244 for frequencies in the second frequency band. These matching networks may be implemented using matching techniques known in the art. As mentioned above, matching networks 218 and 242 may include an extra phase shift to compensate for the phase shift of transmission line impedance transformers 230 and 248, respectively. Matching networks 228 and 240 are used to match frequency selective network 238 to transmission line impedance transformers 230 and 248. In some embodiments, matching networks 228 and 240 may include the phase shift of transmission line impedance transformers 230 and 248. Matching networks 232 and 236 provide matching for main amplifier 234 by providing a broadband match or a dual band match for the two frequency bands.

In an embodiment, input stage 202 couples band 1 to peaking amplifier 220 via power splitter 208 in input section 202, and band 2 to peaking amplifier 244 via power splitter 216. Frequency selective network 212 combines band 1 and band 2 to form a combined input signal for main amplifier 234. In an embodiment, matching network 210 matches one port of frequency selective network 212 for band 1 frequencies and matching network 214 matches another port of frequency selective network 212 for band 2 frequencies. Output stage 206 combines the output of circulators 226 and 252 via frequency selective network 254 to form a multi-band RF output.

Figure 3:
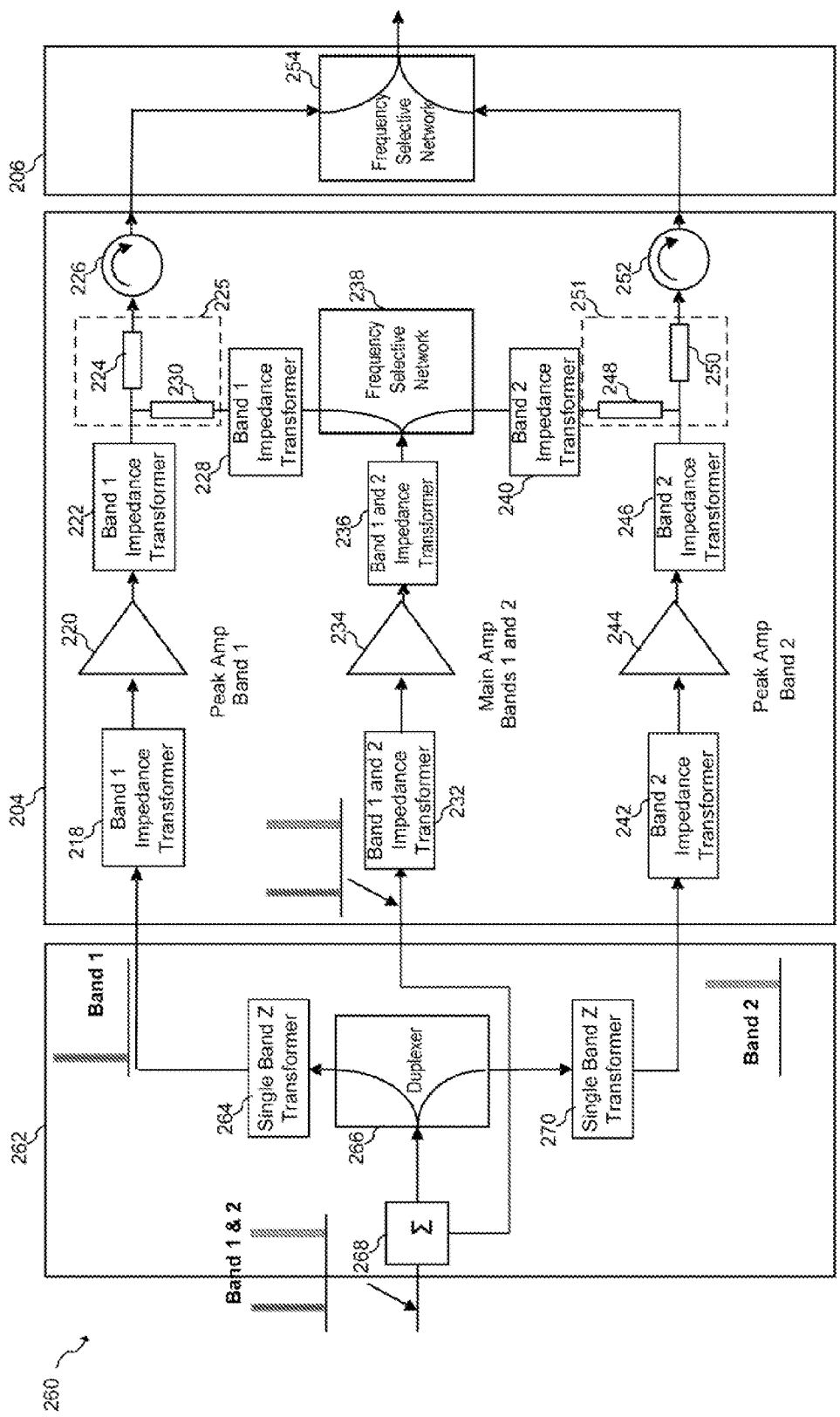
FIG. 3 illustrates a multi-band amplifier according to another embodiment of the present invention.

FIG. 3 illustrates multi-band amplifier 260 according to an alternative embodiment. Here, amplifier section 204 and output section 206 is similar to the embodiment shown in FIG. 2. Input section 262 has splitter 268 coupled to an input signal having signals in both band 1 and in band 2. One output of splitter 268 is coupled to main amplifier 234 via impedance transformer 232, while the other output is coupled to frequency selective network 266. One output of frequency selective network 266 is matched to in band 1 frequencies to peaking amplifier 220 via matching networks 264 and 218, and the other output of frequency selective network 266 is matched to peaking amplifier 244 in band 2 frequencies via matching networks 270 and 242.

Figure 4:
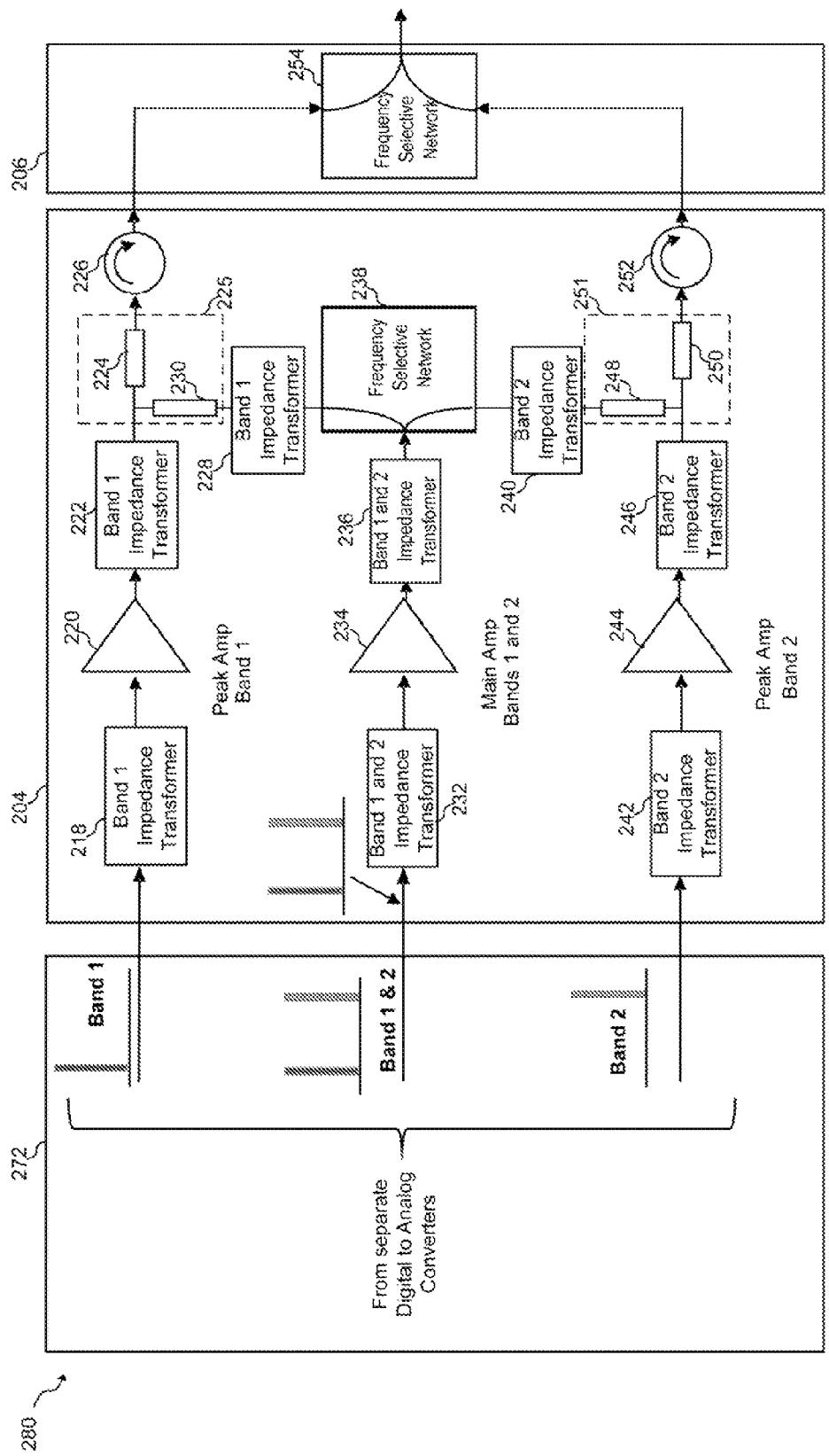
FIG. 4 illustrates a multi-band amplifier according to a further embodiment of the present invention.

FIG. 4 illustrates multi-band amplifier 280 according to a further alternative embodiment. Here, the band 1 input to peaking amplifier 220, the band 2 input to peaking amplifier 244 and the combined band 1 and band 2 input to main amplifier 234 are produced by separate digital to analog converters within input block 272. In alternative embodiments, the inputs to amplifier section 204 may be generated in using other analog and/or digital signal processing and generation techniques depending on the system and its specifications.

Figure 5A:
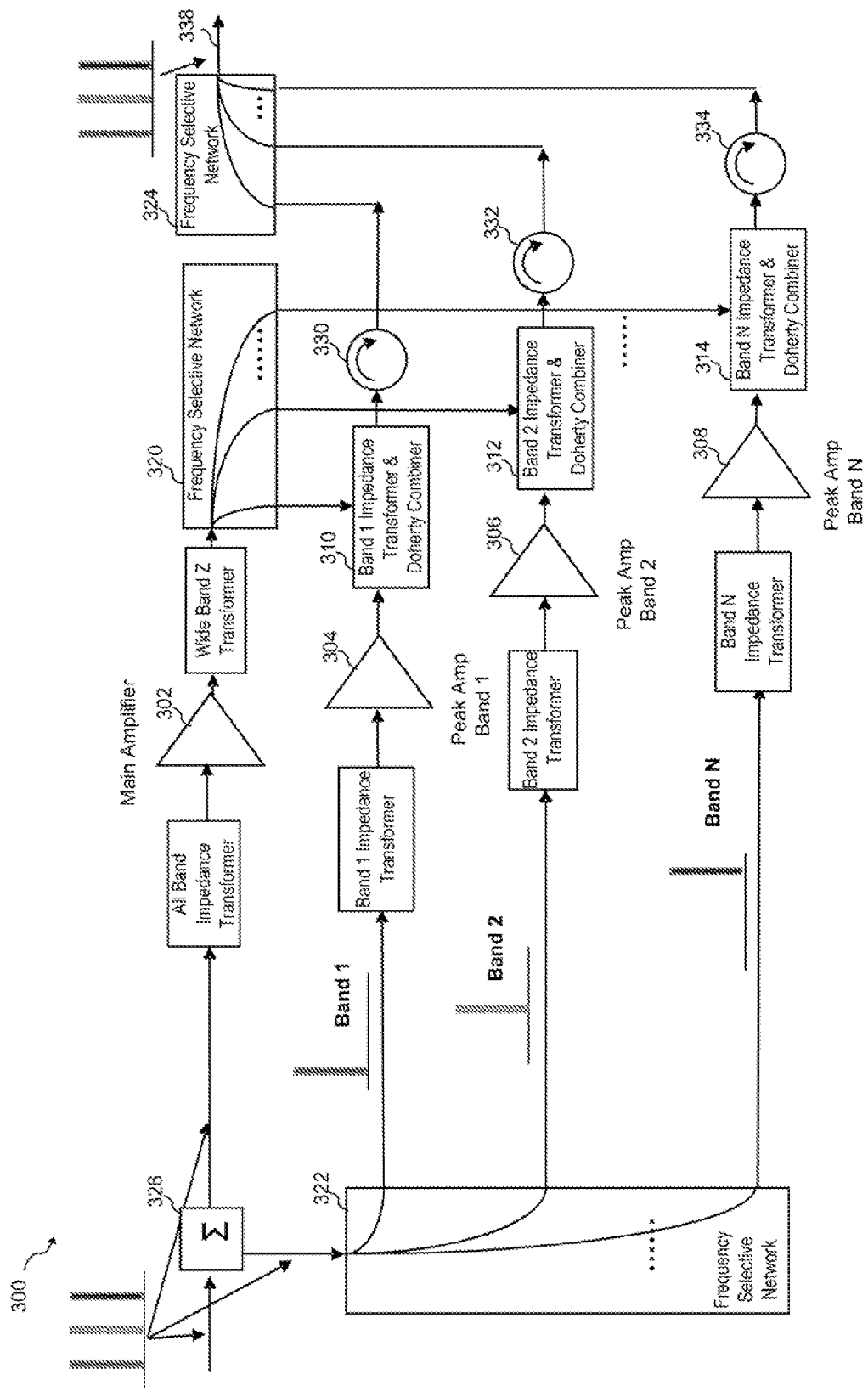
FIGS. 5a-b illustrate schematics of an embodiment multi-band amplifier extended to operate over greater than two frequency bands.

FIG. 5a illustrates how embodiment concepts can be extended to include more than two frequency bands. In embodiment amplification system 300, a multi-band signal is split between main amplifier 302 and frequency selective network 322 via power splitter 326. Each of the frequency bands is selectively amplified by peaking amplifiers 304, 306 and 308, the output of which are coupled to band specific impedance transformers and Doherty combiners 310, 312 and 314 respectively. While only three peaking amplifiers/ narrow band matches are shown for simplicity of illustration, any number of sets of peaking amplifiers and Doherty combiners may be used. Band specific impedance transformers and Doherty combiners 310, 312 and 314 are coupled to the output of main amplifier 302 via frequency selective network 320. In an embodiment, the frequency selective network is a multiplexer with one common port and several input ports that only pass a specific band. The outputs of Doherty combiners 310, 312 and 314 are coupled to circulators 330, 332 and 334, respectively, the outputs of which are combined via frequency selective network 324 to form a multi-band output signal 338.

Figure 5B:
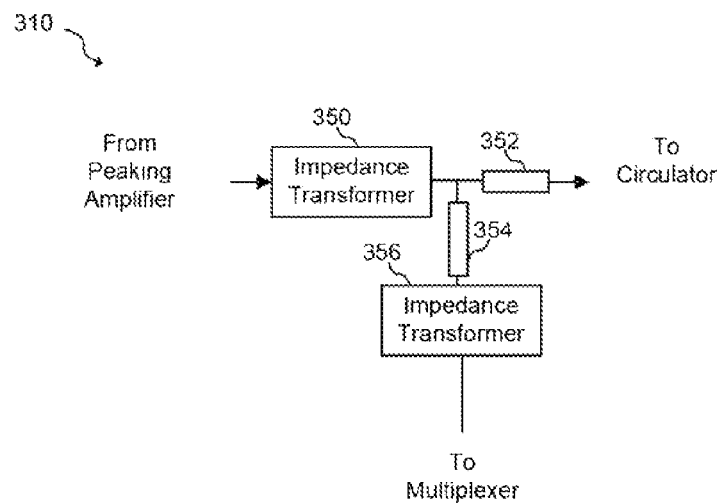

FIG. 5b illustrates a band specific impedance transformer and Doherty combiner 310 used in the multi-band amplifier of FIG. 5a. Narrow-band match and Doherty combiner 310 has matching network 350 configured to be coupled to the peaking amplifier, and matching network 356 configured to be coupled to the multiplexer coupled to main amplifier. Transmission line impedance transformer 354 has a characteristic impedance of the system (i.e. 50Ω), while transmission line impedance transformer 352 has a characteristic impedance of the geometric mean of the isolator impedance and the target load impedance at peak envelope power of the main and/or peaking amplifiers. It should be appreciated that other characteristic impedances may be used in alternative embodiments.

Figure 6:
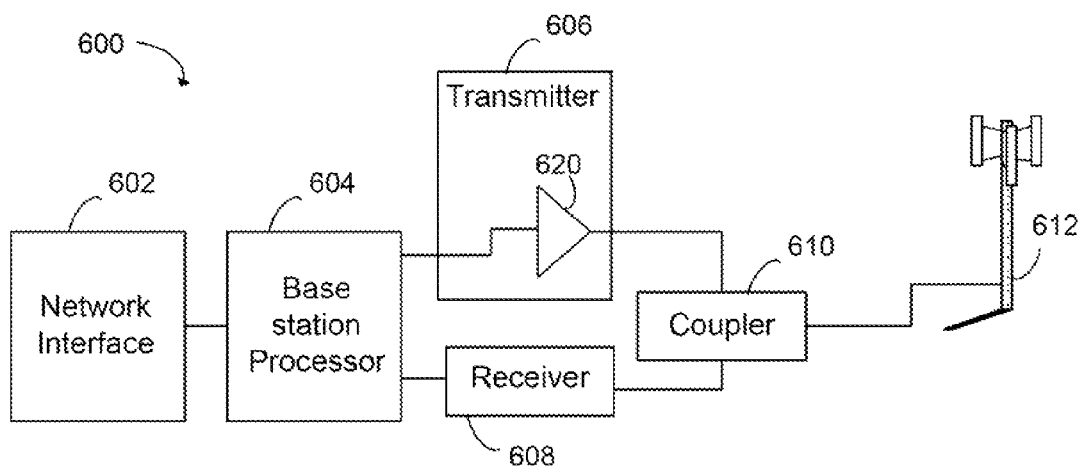
FIG. 6 illustrates a block diagram of an embodiment base station using an embodiment multi-band amplifier.

An embodiment transmission system may be implemented in wireless base station 600, as shown in FIG. 6. Base station 600 has a base station processor 604 coupled to transmitter 606 and receiver 608, and network interface 602. Transmitter 606 and receiver 608 are coupled to antenna 612 via coupler 610. Embodiment transmitter 606 has multi-band amplifier 620 that is implemented according to embodiments of the present invention. In embodiments of the present invention, base station 600 is configured transmit a plurality of bands, and may operate, for example, in a LTE network using an OFDMA downlink channel. In alternative embodiments, other systems, network types and transmission schemes can be used, for example, WiMAX, and/or 1XEV-DO.

Figure 7A:
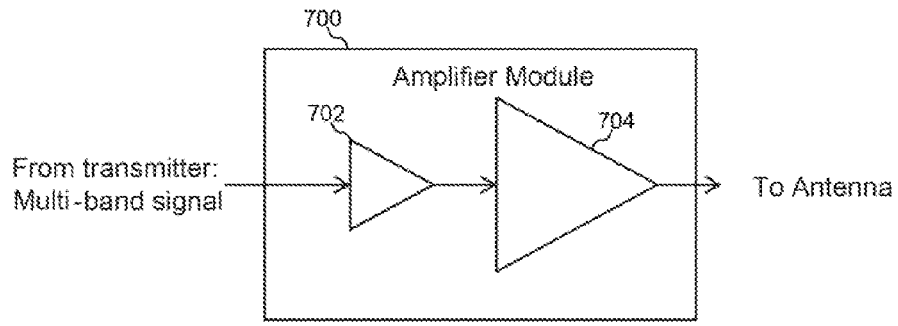
FIGS. 7a-c illustrate amplifier modules according to embodiments of the present invention.
Figure 7B:
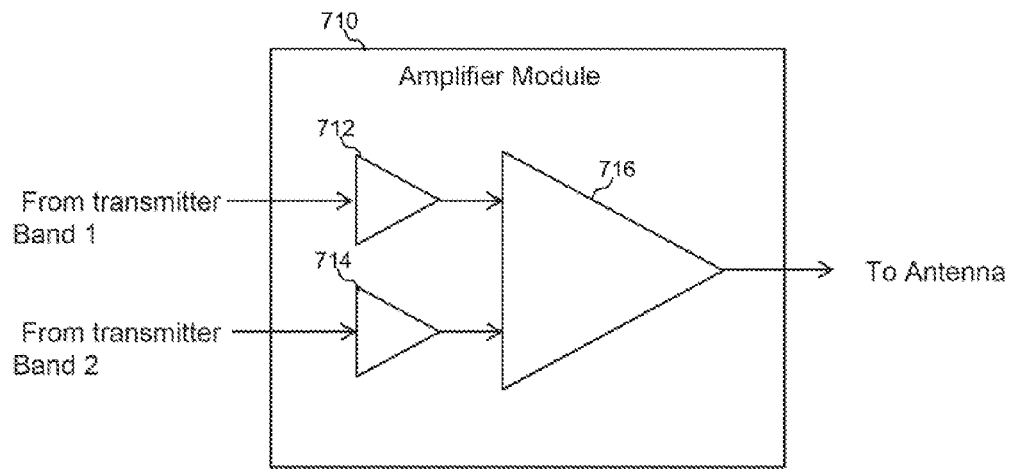
Figure 7C:
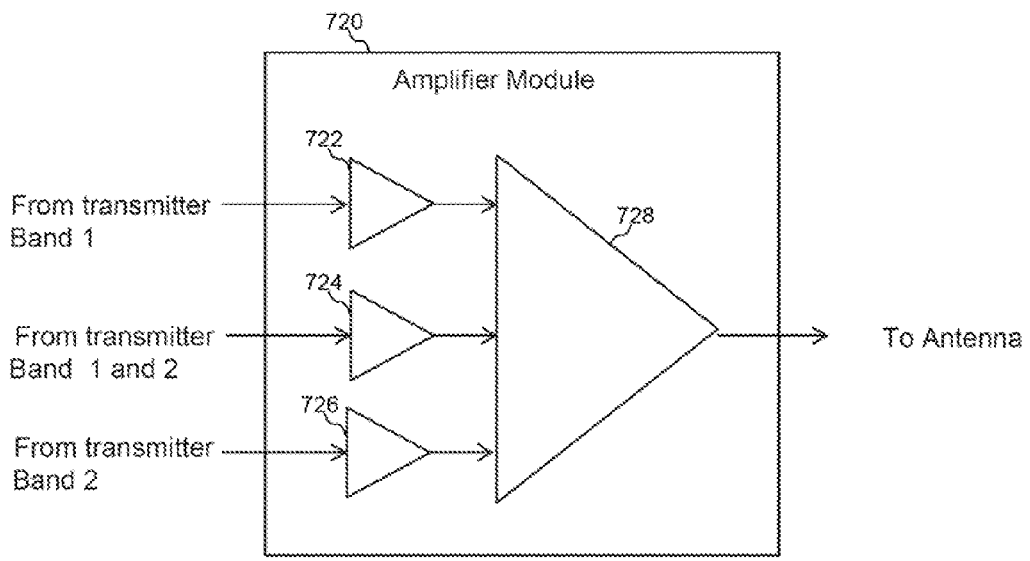

FIGS. 7a-c illustrate amplifier modules according to embodiments of the present invention. In FIG. 7a, amplifier module 700 has driver stage 702 coupled to output stage 704. In an embodiment, driver stage 702, which buffers a multi-band signal, may be implemented using a multi-band class-AB amplifier. Alternatively, other amplifier types may be used. Output stage 704 may be implemented, for example using an embodiment a multi-band Doherty amplifier system, such as the system illustrated in FIG. 3 using input section 262, amplifier section 204 and combiner section 206. Alternatively, other embodiment multi-band Doherty amplifier systems may be used.

FIG. 7b illustrates amplifier module 710 having driver stages 712 and 714 coupled to output stage 716. Driver stages 712 and 714 may be implemented using class AB amplifiers or other amplifier types. In an embodiment, driver amplifier 712 provides band 1 and driver amplifier 714 provides band 2 to output stage 716. Output stage 716 may be implemented using, for example, the multi-band Doherty amplifier system illustrated in FIG. 2a using input section 202, amplifier section 204 and combiner section 206. Alternatively, other embodiment multi-band Doherty amplifier systems may be used.

FIG. 7c illustrates amplifier module 720 having driver stages 722, 724 and 726 coupled to output stage 718. Driver stages 722, 724 and 726 may be implemented using class AB amplifiers or other amplifier types. In an embodiment, driver amplifier 722 provides band 1 and driver amplifier 726 provides band 2 to output stage 728. Driver amplifier 724, on the other hand, provides both band 1 and band 2. Output stage 716 may be implemented using, for example, the multi-band Doherty amplifier system illustrated in FIG. 4 using amplifier section 204 and combiner section 206. Alternatively, other embodiment multi-band Doherty amplifier systems may be used.

In accordance with an embodiment, a method of amplifying a plurality of frequency bands includes amplifying a first frequency band and a second frequency band with a main amplifier, amplifying the first frequency band with a first peaking amplifier, amplifying the second frequency band with a second peaking amplifier, and simultaneously load modulating a load impedance of the main amplifier in the first frequency band with an output of the first peaking amplifier and the load impedance of the main amplifier in the second frequency band with an output of the second peaking amplifier. The method may further include combining outputs of the main amplifier, the first peaking amplifier, the second peaking amplifier to form a multiband RF signal.

In an embodiment, amplifying the first frequency band with the first peaking amplifier includes using a first transistor biased to operate as a class C amplifier, and amplifying the second frequency band with the second peaking amplifier includes using a second transistor biased to operate as a class C amplifier. Amplifying the first and second frequency bands with the main amplifier may include using a third transistor biased to operate as a class AB amplifier.

In an embodiment, simultaneously load modulating includes using a first and second Doherty combiner, a single band matching network and a frequency selective network, such as a duplexer, to couple the outputs of the first and second peaking amplifiers to the output of the main amplifier.

In accordance with a further embodiment, a multiband RF power amplifier includes a plurality of peaking amplifiers, where each of the plurality of peaking amplifiers are configured to amplify a different band of a plurality of frequency bands. The amplifier also has a main amplifier configured to amplify the plurality of frequency bands, and a combiner configured to couple outputs of each of the plurality of peaking amplifiers to an output of the main amplifier, wherein the outputs of the plurality of peaking amplifiers are configured to simultaneously load modulate the output of the main amplifier in each of the plurality of frequency bands.

The combiner may include a first frequency selective multiplexer and a plurality of Doherty Combiners. The multiplexer has a first port coupled to the output of the main amplifier, and a plurality of second ports coupled to corresponding outputs of the peaking amplifiers. The plurality of Doherty combiners are coupled between the plurality of peaking amplifiers and the corresponding plurality of second ports of the first frequency selective multiplexer. The circuit may also include coupling circuit having a second multiplexer including a first port coupled to the combined output and a plurality of second ports coupled to corresponding Doherty combiners. In an embodiment, a plurality of circulators is coupled to the plurality of Doherty combiners.

In an embodiment, each of the plurality of Doherty combiners includes a first transmission line impedance transformer coupled between a peaking amplifier one of the plurality of second ports of the second multiplexer, and a second transmission line impedance transformer coupled between the peaking amplifier and an output port of the Doherty combiner.

In some embodiments, the amplifier also includes a coupling circuit configured to couple outputs of the plurality of peaking amplifiers and the output of the main amplifier to a combined output. The coupling circuit may include a second multiplexer having a first port coupled to the combined output and a plurality of second ports coupled to corresponding Doherty combiners. In some embodiments, the plurality of peaking amplifiers are further configured to independently load modulate the output of the main amplifier in each of the plurality of frequency bands.

In accordance with a further embodiment, a multi-band RF power amplifier includes a main amplifier, a first peaking amplifier, a second peaking amplifier, and a combiner. The main amplifier is configured to amplify a first frequency band and a second frequency band, where the second frequency band different from the first frequency band. The first peaking amplifier is configured to amplify the first frequency band, the second peaking amplifier is configured to amplify the second frequency band, and the combiner couples outputs of the first peaking amplifier and the second peaking amplifier to an output of the main amplifier, where the first peaking amplifier and the second peaking amplifier are configured to simultaneously load modulate the output of the main amplifier.

In an embodiment, the combiner includes a frequency selective network, a first transmission line impedance transformer and a second transmission line impedance transformer. The frequency selective network includes an input port coupled to the output of the main amplifier, a first port configured to selectively pass the first frequency band from the input port, and a second port configured to selectively pass the second frequency band from the input. The first transmission line impedance transformer is coupled between the output of the first peaking amplifier and the first port of the frequency selective network, and the second transmission line impedance transformer is coupled between the output of the second peaking amplifier and the second port of the frequency selective network. In an embodiment, the frequency selective network is a duplexer.

In an embodiment, the combiner further includes a third transmission line impedance transformer coupled between the output of the first peaking amplifier and a first output port, and a fourth transmission line impedance transformer coupled between the output of the second peaking amplifier and a second output port. The coupling circuit may further include a first input, a second input, and an output coupled to the system output. The first and second transmission line impedance transformers may have a first characteristic impedance, and the third and fourth transmission line impedance transformers have a characteristic impedance of a geometric mean between an impedance of the first and second output ports and a load impedance of the main amplifier and first and second peaking amplifiers at a peak envelope power.

In an embodiment, the first transmission line impedance transformer has a first characteristic impedance, and the third transmission line impedance transformer has a characteristic impedance of a geometric mean between an impedance seen by the third transmission line at the first end of the third transmission line and an impedance seen by the third transmission line at the second end of the third transmission line when the first peaking amplifier is at peak envelope power. The second transmission line impedance transformer has a second characteristic impedance, and the fourth transmission line impedance transformer has a characteristic impedance of a geometric mean between an impedance seen by the fourth transmission line at the first end of the fourth transmission line and an impedance seen by the fourth transmission line at the second end of the fourth transmission line when the second peaking amplifier is at peak envelope power. In some embodiments, the first characteristic impedance is about the same as the second characteristic impedance, while in other embodiments, the first characteristic impedance may be different from the second characteristic impedance.

In an embodiment, the multi-band RF power amplifier further includes a first circulator coupled between the third transmission line impedance transformer and the first output port, a second circulator coupled between the fourth transmission line impedance transformer and the second output port. In some embodiments the coupling circuit may also include a duplexer.

In an embodiment, the multi-band RF power amplifier also includes an input coupling circuit having a first power splitter, a second power splitter, and an input combiner. The first power splitter has an input configured to receive a signal having spectral content within the first frequency band, and a first output coupled to an input of the first peaking amplifier. The second power splitter has an input configured to receive a signal having spectral content within the second frequency band, and a first output coupled to an input of the second peaking amplifier. The multi-band RF power amplifier may also include an input combiner having a first input coupled to a second output of the first power splitter, a second input coupled to a second output of the second power splitter and an output coupled to an input of the main amplifier. In some embodiments the input combiner may include a duplexer.

In an alternative embodiment, the input coupling circuit may have a power splitter and a duplexer. The power splitter has an input configured to receive a signal having spectral content within the first frequency band and within the second frequency band, a first output coupled to an input of the main amplifier, and second output, and the a duplexer has an input coupled to the second output of the power splitter, a first output coupled to an input of the first peaking amplifier, and a second output coupled to an input of the second peaking amplifier. The first output of the duplexer is configured to selectively pass the first frequency band and the second output is configured to selectively pass the second frequency band.

In an embodiment, the multi-band RF power amplifier further includes a first signal generator, a second signal generator, and a third signal generator. The first signal generator is coupled to an input of the first peaking amplifier, and the first signal generator is configured to generate a first signal in the first frequency band. The second signal generator is coupled to an input of the second peaking amplifier, and the second signal generator is configured to generate a second signal in the first frequency band. Furthermore, the third signal generator is coupled to an input of the main amplifier, and the third signal generator is configured to generate the second signal combined with the first signal. The first signal generator, the second signal generator and the third signal generator may each comprise a digital-to-analog converter.

In an embodiment, the first and second peaking amplifiers are class-C amplifiers, and the main amplifier is a class B or a class AB amplifier. Moreover, the main amplifier, first peaking amplifier, and second peaking amplifier each include at least one matching network.

In an embodiment, the multi-band RF power amplifier further includes a coupling circuit coupling the outputs of the main amplifier, the first peaking amplifier and the second peaking amplifier to a system output. In some embodiments, the coupling circuit includes a duplexer.

In accordance with a further embodiment, a multi-band RF power amplifier includes a main amplifier, a first peaking amplifier, a second peaking amplifier, a frequency selective network, and a first, second third and fourth impedance line transformer. The main amplifier is configured to amplify a first frequency band and a second frequency band, where the second frequency band different from the first frequency band. The first peaking amplifier is configured to amplify the first frequency band, and the second peaking amplifier is configured to amplify the second frequency band, such that an output of the first peaking amplifier and an output of the second peaking amplifier are configured to load modulate an output of the main amplifier in the first and second bands, respectively. The first duplexer includes an input port coupled to the output of the main amplifier, a first port configured to selectively pass the first frequency band from the input port, and a second port configured to selectively pass the second frequency band from the input port. The first transmission line impedance transformer is coupled between the output of the first peaking amplifier and the first port of the frequency selective network, the second transmission line impedance transformer is coupled between the output of the second peaking amplifier and the second port of the frequency selective network, the third transmission line impedance transformer has a first end coupled to the output of the first peaking amplifier, and the fourth transmission line impedance transformer has a first end coupled to the output of the second peaking amplifier. In an embodiment, the frequency selective network may be implemented using a duplexer. In some embodiments, the duplexer may include lumped elements.

In an embodiment, the multi-band RF power amplifier also includes a combining network having a first input coupled to a second end of the third transmission line impedance transformer, a second input coupled to a second end of the fourth transmission line impedance transformer and a multi-band output. In some embodiments, the RF power amplifier further includes a first circulator coupled between the second end of the third transmission line impedance transformer and the first input of the combining network, and a second circulator coupled between the second end of the fourth transmission line impedance transformer and the second input of the combining network.

In an embodiment, the first peak amplifier includes a transistor, an input matching network tuned to the first frequency band, and an output matching network tuned to the first frequency band. The second peak amplifier includes a transistor, an input matching network tuned to the second frequency band, and an output matching network tuned to the second frequency band. In some embodiments, the main amplifier includes a class AB amplifier, the first peak amplifier includes a class C amplifier, and the second peak amplifier includes a class C amplifier.

In an embodiment, the first and second ports of the frequency selective network are isolated from each other, such that the first frequency band is not passed from the first port to the second port, and the second frequency band is not passed from the second port to the first port.

Some embodiments of the present invention include the ability to use only three transistors in a Doherty-like configuration to implement an efficient multi-band power amplifier that amplifiers two frequency bands rather than two Doherty amplifiers each using two transistors.

Although present embodiments and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of amplifying a plurality of frequency bands, the method comprising:
    amplifying a first frequency band and a second frequency band with a main amplifier;
    amplifying the first frequency band with a first peaking amplifier;
    amplifying the second frequency band with a second peaking amplifier; and
    load modulating a load impedance of the main amplifier in the first frequency band with an output of the first peaking amplifier and load modulating the load impedance of the main amplifier in the second frequency band with an output of the second peaking amplifier, wherein the first peaking amplifier modulates the load impedance of the main amplifier at the same time that the second peaking amplifier modulates the load impedance of the main amplifier.

2. The method of claim 1, further comprising combining outputs of the main amplifier, the first peaking amplifier, the second peaking amplifier to form an multiband RF signal.

3. The method of claim 1, wherein:
    amplifying the first frequency band with the first peaking amplifier comprises using a first transistor biased to operate as a class C amplifier; and
    amplifying the second frequency band with the second peaking amplifier comprises using a second transistor biased to operate as a class C amplifier.

4. The method of claim 3, wherein amplifying the first and second frequency bands with the main amplifier comprises using a third transistor biased to operate as a class AB amplifier.

5. The method of claim 1, wherein simultaneously load modulating comprises using a first and second Doherty combiner, single band matching network and a frequency selective network to couple the outputs of the first and second peaking amplifiers to the output of the main amplifier.

6. The method of claim 5, wherein the using the frequency selective network comprises using a duplexer.

7. A multiband RF power amplifier comprising:
    a plurality of peaking amplifiers, each of the plurality of peaking amplifiers configured to amplify a different band of a plurality of frequency bands;
    a main amplifier configured to amplify the plurality of frequency bands; and
    a combiner configured to couple outputs of each of the plurality of peaking amplifiers to an output of the main amplifier, wherein the outputs of the plurality of peaking amplifiers are configured to simultaneously load modulate the output of the main amplifier in each of the plurality of frequency bands.

8. The multiband RF power amplifier of claim 7, wherein: the combiner comprises
    a first frequency selective multiplexer having a first port coupled to the output of the main amplifier, and a plurality of second ports coupled to corresponding outputs of the peaking amplifiers, and
    a plurality of Doherty combiners coupled between the plurality of peaking amplifiers and the corresponding plurality of second ports of the first frequency selective multiplexer.

9. The multiband RF power amplifier of claim 8, further comprising a plurality of circulators coupled to the plurality of Doherty combiners.

10. The multiband RF power amplifier of claim 8, wherein each of the plurality of Doherty combiners comprises a first transmission line impedance transformer coupled between a peaking amplifier one of the plurality of second ports of the first frequency selective multiplexer, and a second transmission line impedance transformer coupled between the peaking amplifier and an output port of the Doherty combiner.

11. The multiband RF power amplifier of claim 8, further comprising a coupling circuit configured to couple outputs of the plurality of peaking amplifiers and the output of the main amplifier to a combined output, the coupling circuit comprising a second multiplexer having a first port coupled to the combined output and a plurality of second ports coupled to corresponding Doherty combiners.

12. The multiband RF power amplifier of claim 7, wherein the plurality of peaking amplifiers are further configured to independently load modulate the output of the main amplifier in each of the plurality of frequency bands.

13. A multi-band RF power amplifier comprising:
    a main amplifier configured to amplify a first frequency band and a second frequency band, the second frequency band different from the first frequency band;
    a first peaking amplifier configured to amplify the first frequency band;
    a second peaking amplifier configured to amplify the second frequency band; and
    a combiner coupling outputs of the first peaking amplifier and the second peaking amplifier to an output of the main amplifier, wherein the first peaking amplifier and the second peaking amplifier are configured to simultaneously load modulate the output of the main amplifier.

14. The multi-band RF power amplifier of claim 13, wherein the combiner comprises:
    a frequency selective network comprising:
        an input port coupled to the output of the main amplifier,
        a first port configured to selectively pass the first frequency band from the input port, and
        a second port configured to selectively pass the second frequency band from the input;
    a first transmission line impedance transformer coupled between the output of the first peaking amplifier and the first port of the frequency selective network; and
    a second transmission line impedance transformer coupled between the output of the second peaking amplifier and the second port of the frequency selective network.

15. The multi-band RF power amplifier of claim 14, wherein the frequency selective network comprises a duplexer.

16. The multi-band RF power amplifier of claim 14, wherein the combiner further comprises:
    a third transmission line impedance transformer having a first end coupled to the output of the first peaking amplifier and a second end coupled to a first output port; and
    a fourth transmission line impedance transformer having a first end coupled to the output of the second peaking amplifier and a second end coupled to a second output port.

17. The multi-band RF power amplifier of claim 16, wherein:
the first transmission line impedance transformer has a first characteristic impedance;
the third transmission line impedance transformer has a characteristic impedance of a geometric mean between an impedance seen by the third transmission line at the first end of the third transmission line and an impedance seen by the third transmission line at the second end of the third transmission line when the first peaking amplifier is at peak envelope power;
the second transmission line impedance transformer has a second characteristic impedance; and
the fourth transmission line impedance transformer has a characteristic impedance of a geometric mean between an impedance seen by the fourth transmission line at the first end of the fourth transmission line and an impedance seen by the fourth transmission line at the second end of the fourth transmission line when the second peaking amplifier is at peak envelope power.

18. The multi-band RF power amplifier of claim 16, further comprising
a first circulator coupled between the third transmission line impedance transformer and the first output port; and
a second circulator coupled between the fourth transmission line impedance transformer and the second output port.

19. The multi-band RF power amplifier of claim 13, further comprising an input coupling circuit comprising:
a first power splitter having an input configured to receive a signal having spectral content within the first frequency band, and a first output coupled to an input of the first peaking amplifier;
a second power splitter having an input configured to receive a signal having spectral content within the second frequency band, and a first output coupled to an input of the second peaking amplifier; and
an input combiner having a first input coupled to a second output of the first power splitter, a second input coupled to a second output of the second power splitter and an output coupled to an input of the main amplifier.

20. The multi-band RF power amplifier of claim 19, wherein the input combiner comprises a duplexer.

21. The multi-band RF power amplifier of claim 13, further comprising an input coupling circuit comprising:
a power splitter having an input configured to receive a signal having spectral content within the first frequency band and within the second frequency band, a first output coupled to an input of the main amplifier, and second output; and
a duplexer having an input coupled to the second output of the power splitter, a first output coupled to an input of the first peaking amplifier, and a second output coupled to an input of the second peaking amplifier, wherein the first output is configured to selectively pass the first frequency band and the second output is configured to selectively pass the second frequency band.

22. The multi-band RF power amplifier of claim 13, further comprising:
a first signal generator coupled to an input of the first peaking amplifier, the first signal generator configured to generate a first signal in the first frequency band;
a second signal generator coupled to an input of the second peaking amplifier, the second signal generator configured to generate a second signal in the first frequency band; and a third signal generator coupled to an input of the main amplifier, the third signal generator configured to generate the second signal combined with the first signal.

23. The multi-band RF power amplifier of claim 22, wherein the first signal generator, the second signal generator and the third signal generator each comprise a digital-to-analog converter.

24. The multi-band RF power amplifier of claim 13, wherein the first and second peaking amplifiers are class-C amplifiers, and the main amplifier is a class B or a class AB amplifier.

25. The multi-band RF power amplifier of claim 13, wherein the main amplifier, first peaking amplifier, and second peaking amplifier each comprise at least one matching network.

26. The multi-band RF power amplifier of claim 13, further comprising a coupling circuit coupling the outputs of the main amplifier, the first peaking amplifier and the second peaking amplifier to a system output.

27. The multi-band RF power amplifier of claim 26, wherein the coupling circuit comprises a duplexer.

28. A multi-band RF power amplifier comprising:
a main amplifier configured to amplify a first frequency band and a second frequency band, the second frequency band different from the first frequency band;
a first peaking amplifier configured to amplify the first frequency band;
a second peaking amplifier configured to amplify the second frequency band, wherein an output of the first peaking amplifier and an output of the second peaking amplifier are configured to load modulate an output of the main amplifier in the first and second bands, respectively;
a frequency selective network comprising:
an input port coupled to the output of the main amplifier,
a first port configured to selectively pass the first frequency band from the input port, and
a second port configured to selectively pass the second frequency band from the input port;
a first transmission line impedance transformer coupled between the output of the first peaking amplifier and the first port of the frequency selective network;
a second transmission line impedance transformer coupled between the output of the second peaking amplifier and the second port of the frequency selective network;
a third transmission line impedance transformer having a first end coupled to the output of the first peaking amplifier; and
a fourth transmission line impedance transformer having a first end coupled to the output of the second peaking amplifier.

29. The multi-band RF power amplifier of claim 28, further comprising a combining network having a first input coupled to a second end of the third transmission line impedance transformer, a second input coupled to a second end of the fourth transmission line impedance transformer and an multi-band output.

30. The multi-band RF power amplifier of claim 29, further comprising:
a first circulator coupled between the second end of the third transmission line impedance transformer and the first input of the combining network; and
a second circulator coupled between the second end of the fourth transmission line impedance transformer and the second input of the combining network.

31. The multi-band RF power amplifier of claim 28, wherein:

the first peak amplifier comprises
- a transistor,
- an input matching network tuned to the first frequency band, and
- an output matching network tuned to the first frequency band; and the second peak amplifier comprises
- a transistor,
- an input matching network tuned to the second frequency band, and
- an output matching network tuned to the second frequency band.

32. The multi-band RF power amplifier of claim 28, wherein:
the main amplifier comprises a class AB amplifier;
the first peak amplifier comprises a class C amplifier; and
the second peak amplifier comprises a class C amplifier.

33. The multi-band RF power amplifier of claim 28, wherein the first and second ports of the frequency selective network are isolated from each other, wherein the first frequency band is not passed from the first port to the second port, and the second frequency band is not passed from the second port to the first port.

34. The multi-band RF power amplifier of claim 28, wherein the frequency selective network comprises a duplexer.

35. The multi-band RF power amplifier of claim 34, wherein the duplexer comprises lumped elements.

\* \* \* \* \*